(12) United States Patent
Ishiguro et al.

(10) Patent No.: US 9,312,341 B2
(45) Date of Patent: Apr. 12, 2016

(54) COMPOUND SEMICONDUCTOR DEVICE, POWER SOURCE DEVICE AND HIGH FREQUENCY AMPLIFIER AND METHOD FOR MANUFACTURING THE SAME

(71) Applicant: FUJITSU LIMITED, Kawasaki-shi, Kanagawa (JP)

(72) Inventors: Tetsuro Ishiguro, Kawasaki (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 128 days.

(21) Appl. No.: 14/186,468

(22) Filed: Feb. 21, 2014

(65) Prior Publication Data
US 2014/0291725 A1  Oct. 2, 2014

(30) Foreign Application Priority Data

Mar. 29, 2013  (JP) ................................. 2013-073401

(51) Int. Cl.
| | |
|---|---|
| *H01L 29/205* | (2006.01) |
| *H01L 21/02* | (2006.01) |
| *H01L 29/36* | (2006.01) |
| *H01L 29/778* | (2006.01) |
| *H01L 29/10* | (2006.01) |
| *H01L 29/20* | (2006.01) |
| *H01L 21/762* | (2006.01) |

(52) U.S. Cl.
CPC .......... *H01L 29/205* (2013.01); *H01L 21/0254* (2013.01); *H01L 21/0262* (2013.01); *H01L 21/02381* (2013.01); *H01L 21/02458* (2013.01); *H01L 21/02502* (2013.01); *H01L 21/02576* (2013.01); *H01L 21/76224* (2013.01); *H01L 29/1075* (2013.01); *H01L 29/2003* (2013.01); *H01L 29/36* (2013.01); *H01L 29/7787* (2013.01)

(58) Field of Classification Search
CPC .............. H01L 29/205; H01L 21/0254; H01L 21/0257; H01L 21/02381; H01L 21/02458; H01L 21/02502; H01L 21/02576; H01L 21/0262; H01L 29/36; H01L 29/7787; H01L 29/1075; H01L 29/2003
See application file for complete search history.

(56) References Cited

U.S. PATENT DOCUMENTS

| | | | |
|---|---|---|---|
| 2005/0241571 A1 | 11/2005 | Kim | |
| 2006/0281238 A1* | 12/2006 | Harris | ................. H01L 29/7783 438/172 |
| 2010/0289067 A1* | 11/2010 | Mishra | ................. H01L 29/2003 257/268 |
| 2012/0049180 A1* | 3/2012 | Yamada | .............. H01L 29/2003 257/43 |

FOREIGN PATENT DOCUMENTS

| | | |
|---|---|---|
| JP | 2005-317909 A1 | 11/2005 |
| JP | 2007-67077 A1 | 3/2007 |
| JP | 2012-23314 A1 | 2/2012 |

OTHER PUBLICATIONS

A.Y. Polyakov, et al.; "Electrical and optical properties of Fe-doped semi-insulating GaN templates;" Applied Physics Letters; vol. 83; No. 16; Oct. 20, 2003; pp. 3314-3316 and cover sheet (4 Sheets)/p. 3 of specification.

* cited by examiner

*Primary Examiner* — Selim Ahmed
(74) *Attorney, Agent, or Firm* — Kratz, Quintos & Hanson, LLP

(57) ABSTRACT

A compound semiconductor device includes: a substrate; and a compound semiconductor lamination structure formed over the substrate, the compound semiconductor lamination structure including a buffer layer containing an impurity, and an active layer formed over the buffer layer.

11 Claims, 11 Drawing Sheets

THERMAL CONTRACTION IN TEMPERATURE DECREASE

HEIGHT PROFILE FROM REFERENCE PLANE

COMPOUND SEMICONDUCTOR DEVICE, POWER SOURCE DEVICE AND HIGH FREQUENCY AMPLIFIER AND METHOD FOR MANUFACTURING THE SAME

CROSS-REFERENCE TO RELATED APPLICATION

This application is based upon and claims the benefit of priority of the prior Japanese Patent Application No. 2013-073401, filed on Mar. 29, 2013, the entire contents of which are incorporated herein by reference.

FIELD

The embodiments discussed herein are related to a compound semiconductor device and a method for manufacturing the same.

BACKGROUND

Development of a compound semiconductor device, in particular, a nitride semiconductor device, has been actively carried out to realize a semiconductor device having a high withstand voltage and a high output using features, such as a high saturated electron speed and a wide bandgap. As for the nitride semiconductor device, many reports on field-effect transistors, in particular, on a high electron mobility transistor (HEMT), have been disclosed. Specifically, as a GaN semiconductor device containing GaN, an AlGaN/GaN HEMT in which GaN is used as an active layer (electron transit layer) and AlGaN is used as an electron supply layer has attracted attention. In the AlGaN/GaN HEMT, strain is generated in AlGaN by the difference in lattice constant between GaN and AlGaN. By piezoelectric polarization generated by this strain and spontaneous polarization of AlGaN, a high concentration two-dimensional electron gas (2DEG) may be obtained. Hence, a semiconductor device having a high withstand voltage and a high output may be realized.

In the GaN semiconductor device, since an inexpensive and a large-diameter Si substrate may be used as a substrate for crystal growth, a significant reduction in manufacturing cost may be advantageously expected.

In the GaN semiconductor device, it has been confirmed that for example, when GaN is formed as a nitride layer functioning as an active layer, as the thickness of this GaN is increased, the number of defects is decreased, and as a result, the quality is improved. As a particular example, the results obtained through investigation on GaN layers having thicknesses of 200 nm and 600 nm by an x-ray rocking curve method (XRC method) are depicted in FIGS. 1A and 1B.

However, although the manufacturing cost may be reduced, when a thick GaN active layer is formed on a Si substrate so as to obtain an active layer having a small number of defects and a high quality, the following problems may arise.

For example, as depicted in a part (a) of FIG. 2, a thick GaN layer 103 is formed on a Si substrate 101 with an AlN buffer layer 102 interposed therebetween. The lattice constant of Si is larger than that of GaN, and the coefficient of thermal expansion of GaN is larger than that of Si. Hence, when the temperature is decreased after the active layer 103 is formed, a downward convex warp is generated by thermal contraction as depicted in a part (b) of FIG. 2. This warp is increased as the thickness of the GaN layer 103 is increased, and as a result, a crack is liable to occur. This phenomenon indicates that improvement in dielectric breakdown withstand voltage of the device expected by an increase in thickness of a nitride layer originally having a wide bandgap and high insulating properties and improvement in quality caused by a decrease in dislocation density are to be restricted.

As a method to overcome the above problem, that is, as a method for increasing the thickness of a nitride layer while the generation of warp and crack is suppressed, for example, there have been known a stepwise AlGaN buffer in which several AlGaN layers having different Al composition ratios are laminated to each other and a strained layer superlattice (SLS) buffer in which the structure formed by alternately laminating a GaN thin film and an AlN thin film many cycles is inserted under a GaN electron transit layer. In both of the above structures, since a large internal compressive strain is generated in the GaN electron transit layer, an intense tensile strain of the entire nitride layers generated in a temperature decrease step performed after the film formation is cancelled out, so that the generation of warp and crack is suppressed. However, since the buffer structures as described above each inevitably become complicated, and the total film-forming time is increased, this increase in time may be one of causes to inhibit improvement in throughput. In addition, the consumption amounts of raw materials, such as expensive organic metal materials, are also increased, and hence, this increase becomes a bottleneck of a mass production process.

The followings are reference documents:
[Document 1] Japanese Laid-open Patent Publication No. 2012-23314,
[Document 2] Japanese Laid-open Patent Publication No. 2007-67077,
[Document 3] Japanese Laid-open Patent Publication No. 2005-317909, and
[Document 4] A. Y. Polyakov, et al. "Electrical and optical properties of Fe-doped semi-insulating GaN templates", *Applied Physics Letters*, Vol. 83, Number 16 (2003).

SUMMARY

According to an aspect of the invention, a compound semiconductor device includes: a substrate; and a compound semiconductor lamination structure formed over the substrate, the compound semiconductor lamination structure including a buffer layer containing an impurity, and an active layer formed over the buffer layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

In this embodiment, as a compound semiconductor device, a nitride semiconductor device, that is, an AlGaN/GaN HEMT, will be described.

FIGS. 3A, 3B, 3C, 4A, and 4B are schematic cross-sectional views sequentially illustrating steps of a method for manufacturing an AlGaN/GaN HEMT according to a first embodiment.

Figure 3A:
FIG. 3A is a schematic cross-sectional view illustrating a step of a method for manufacturing an AlGaN/GaN HEMT according to a first embodiment.

First, as depicted in FIG. 3A, as a substrate for crystal growth, for example, a Si substrate 1 is prepared.

As the substrate for crystal growth, for example, a SiC substrate may also be used instead of using a Si substrate. As the substrate for crystalline growth, an inexpensive and a large-diameter Si substrate or SiC substrate may be used, and hence, a significant reduction in manufacturing cost may be expected thereby.

Figure 3B:
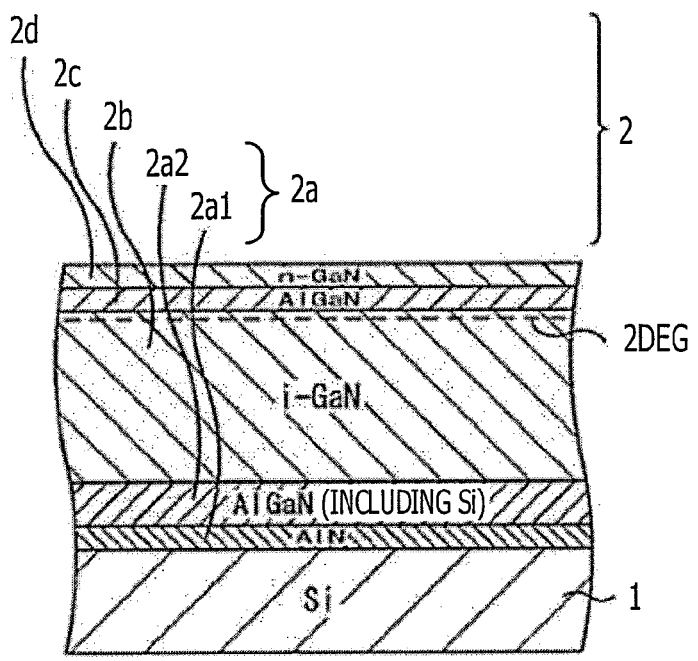
FIG. 3B is a schematic cross-sectional view illustrating a step following the step depicted in FIG. 3A.

Next, as depicted in FIG. 3B, on the Si substrate 1, a compound semiconductor lamination structure 2 is formed as a laminate including a plurality of compound semiconductor layers.

In particular, first, a heat treatment is performed on the Si substrate 1 in a $H_2$ atmosphere for several minutes. Subsequently, the compound semiconductor layers, which form the compound semiconductor lamination structure 2, are sequentially grown on the Si substrate 1, for example, by a metal organic vapor phase epitaxy (MOVPE) method. Instead of using a MOVPE method, for example, a molecular beam epitaxy (MBE) method may also be used.

The compound semiconductor lamination structure 2 is formed of a buffer layer 2a, an electron transit layer 2b functioning as an active layer, an electron supply layer 2c, and a cap layer 2d. Between the electron transit layer 2b and the electron supply layer 2c, for example, a thin spacer layer of AlGaN may also be formed.

In the compound semiconductor lamination structure 2, a two-dimensional electron gas (2DEG) is generated in the vicinity of the interface between the electron transit layer 2b and the electron supply layer 2c. This 2DEG is generated based on the difference in lattice constant between a compound semiconductor (GaN in this embodiment) of the electron transit layer 2b and a compound semiconductor (AlGaN in this embodiment) of the electron supply layer 2c.

In this embodiment, the buffer layer 2a includes a first buffer layer 2a1 and a second buffer layer 2a2 formed thereon.

The first buffer layer 2a1 is formed of a compound semiconductor containing no impurities. The second buffer layer 2a2 is formed of a compound semiconductor containing an impurity, such as an n-type impurity (Si or the like). As the impurity to be contained, instead of the n-type impurity, a p-type impurity, such as Fe, Mg, or C, may also be used. In order to match the lattice constants of adjacent layers as much as possible, as the compound semiconductor of the second buffer layer 2a2, a compound semiconductor having a lattice constant larger than that of the first buffer layer 2a1 and smaller than that of the electron transit layer 2b is used. When the first buffer layer 2a1 is formed, for example, of AlN, and the electron transit layer 2b is formed, for example, of GaN, the second buffer layer 2a2 may be formed, for example, of AlGaN containing the impurity described above.

AlN is grown on the Si substrate 1. As a raw material gas, a mixed gas containing trimethyl aluminum (TMAl) gas and an ammonium ($NH_3$) gas is used. The flow rate of the $NH_3$ gas is set to approximately 100 ccm to 10 Lm. A growth pressure is set to approximately 50 to 300 Torr, and a growth temperature is set to approximately 1,000° C. to 1,200° C. The raw material gas is supplied into a reaction furnace with a carrier gas ($H_2$), the flow rate of which is controlled by a mass flow controller (MFC).

Since this AlN functions to form growth nuclei at an initial growth stage, first, a first AlN layer having a thickness of approximately several to several tens of nanometers is grown in which a V/III ratio (ratio of a mole supply amount per hour of a group V raw material to that of a group III raw material) is set to be relatively high. Next, on the first AlN layer thus grown, a flat second AlN layer having a thickness of approximately several tens to several hundreds of nanometers is grown in which the V/III ratio is set to be lower. More preferably, the first AlN layer has a V/III ratio of approximately 1,000 or less, and the second AlN layer has a V/III ratio of approximately 10 or less. Accordingly, the first buffer layer 2a1 is formed on the Si substrate 1.

AlGaN doped with Si is grown on the first buffer layer 2a1. As a raw material gas, a mixed gas containing a TMAl gas, a trimethyl gallium (TMGa) gas, and an $NH_3$ gas is used. The flow rate of the $NH_3$ gas is set to approximately 100 ccm to 10 LM. The growth pressure is set to approximately 50 to 300 Torr, and the growth temperature is set to approximately 1,000° C. to 1,200° C. For example, a $SiH_4$ gas containing Si as an n-type impurity is used, and this gas is added at a predetermined flow rate to the raw material gas described above so as to dope AlGaN with Si.

In order to control the warp generated after the electron transit layer 2b is formed, the thickness and the Al composition ratio of this AlGaN are important, and the lattice constant of the uppermost surface layer thereof is preferably set small as compared to that of the electron transit layer 2b to be formed on the AlGaN. In addition, the uppermost surface layer of this AlGaN is preferably sufficiently planarized as an underlayer for the electron transit layer 2b. In general, since AlGaN is likely to be planarized when having a small Al composition ratio and a composition closer to that of GaN, the Al composition ratio of the uppermost surface layer of this AlGaN is set to approximately 20% to 50% and is set to approximately 30% in this embodiment.

In addition, this AlGaN is more preferable when having a larger thickness. In this case, when the thickness of a single layer having a small Al composition ratio is increased, a crack is generated by the difference of the lattice constant thereof from that of the first buffer layer 2a1 functioning as an underlayer; hence, a laminate structure including approximately two to three layers is formed so that the Al composition ratio is decreased from the lower layer to the upper layer. In this embodiment, although three AlGaN layers are grown, a multilayer structure in which at least four layers are laminated to each other may also be formed as long as the conditions described above are satisfied. In addition, in order to suppress the generation of crack in a temperature decrease step which is caused by an excessive increase in thickness, the thickness of this AlGaN (total thickness of the AlGaN laminate structure) is set to approximately 500 to 1,000 nm.

Doping of Si is performed over this AlGaN to have a Si concentration of approximately $1 \times 10^{16}$ to $1 \times 10^{18}$ atoms/cm$^3$, and a preferable concentration is approximately $1 \times 10^{17}$ atoms/cm$^3$. When the Si concentration is controlled in the range described above, degradation in crystallinity (increase in dislocation density) of the electron transit layer 2b caused by excessive doping of Si may be suppressed.

Accordingly, the second buffer layer 2a2 is formed on the first buffer layer 2a1. The buffer layer 2a is formed from the first buffer layer 2a1 and the second buffer layer 2a2.

Intentionally undoped (hereinafter referred to as "i-" in some cases) GaN is grown on the second buffer layer 2a2.

As a raw material gas, a mixed gas containing a TMGa gas and an NH$_3$ gas is used. The flow rate of the NH$_3$ gas is set to approximately 100 ccm to 10 LM. The growth pressure is set to be a high pressure of approximately 60 kPa or more, and the growth temperature is set to approximately 1,000° C. to 1,200° C.

In order to avoid the degradation in crystallinity caused by dislocation transmitted from the buffer layer 2a to a surface layer of the i-GaN, this i-GaN is preferably grown to have a relatively large thickness, such as approximately 500 to 1,000 nm. When the growth pressure of this i-GaN is set to a high pressure of 60 kPa or more, and the V/III ratio is set to be high, such as 10,000 or more, a high quality i-GaN having a significantly low impurity concentration may be obtained. Accordingly, the electron transit layer 2b is formed on the second buffer layer 2a2.

AlGaN is grown on the electron transit layer 2b. The thickness of AlGaN is approximately 20 nm, and as a raw material gas, a mixed gas containing a TMAl gas, a TMGa gas, and an NH$_3$ gas is used. The flow rate of the NH$_3$ gas is set to approximately 100 ccm to 10 LM. The growth pressure is set to approximately 50 to 300 Torr, and the growth temperature is set to approximately 1,000° C. to 1,200° C. The thickness of this AlGaN is set to approximately 20 nm. In order to avoid the degradation in crystallinity caused by lattice mismatch with the electron transit layer 2b, for example, the Al composition ratio is set to approximately 30% or less. As this AlGaN, there may also be used n-AlGaN which is prepared by adding an n-type impurity, such as Si, to the above raw material gas. Accordingly, the electron supply layer 2c is formed on the electron transit layer 2b.

An n-type GaN (n-GaN) is grown on the electron supply layer 2c. As a raw material gas, a mixed gas containing a TMGa gas and an NH$_3$ gas is used. The flow rate of the NH$_3$ gas is set to approximately 100 ccm to 10 LM. The growth pressure is set to approximately 50 to 300 Torr, and the growth temperature is set to approximately 1,000° C. to 1,200° C. For example, a SiH$_4$ gas containing Si as an n-type impurity is used and is added at a predetermined flow rate to the above raw material gas so as to dope Si. The doping concentration of Si is set to approximately $1 \times 10^{18}$ to $1 \times 10^{20}$ atoms/cm$^3$, such as approximately $5 \times 10^{18}$ atoms/cm$^3$. The thickness of this n-GaN is set to approximately several nanometers. Accordingly, the cap layer 2d is formed on the electron supply layer 2c.

Figure 3C:
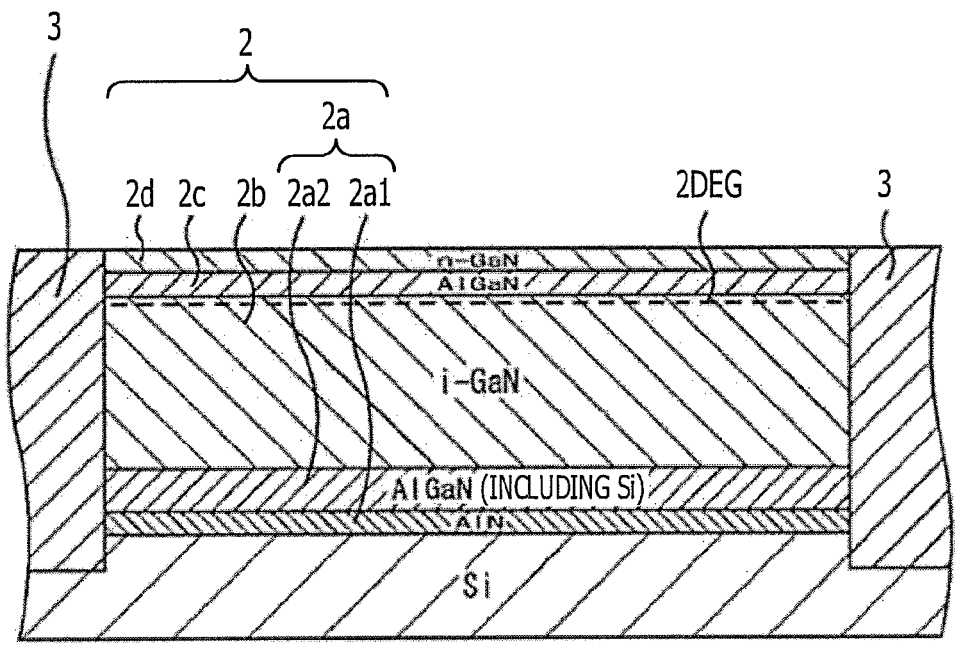
FIG. 3C is a schematic cross-sectional view illustrating a step following the step depicted in FIG. 3B.

Subsequently, as depicted in FIG. 3C, an element isolation region 3 is formed. In addition, in FIG. 4A and the following figures, the element isolation region 3 is omitted.

In particular, for example, argon (Ar) is ion-planted in a portion which is to be used as an inactive region of the compound semiconductor lamination structure 2. Accordingly, the element isolation region 3 is formed along the periphery of the compound semiconductor lamination structure 2 and in a surface layer portion of the Si substrate 1. By this element isolation region 3, an element region (transistor region) of the AlGaN/GaN HEMT is defined on the compound semiconductor lamination structure 2.

In addition, the element isolation may be performed, for example, by a shallow trench isolation (STI) method instead of using the above plantation method. In this case, for dry etching of the compound semiconductor lamination structure 2, for example, a chlorine-based etching gas may be used.

Figure 4A:
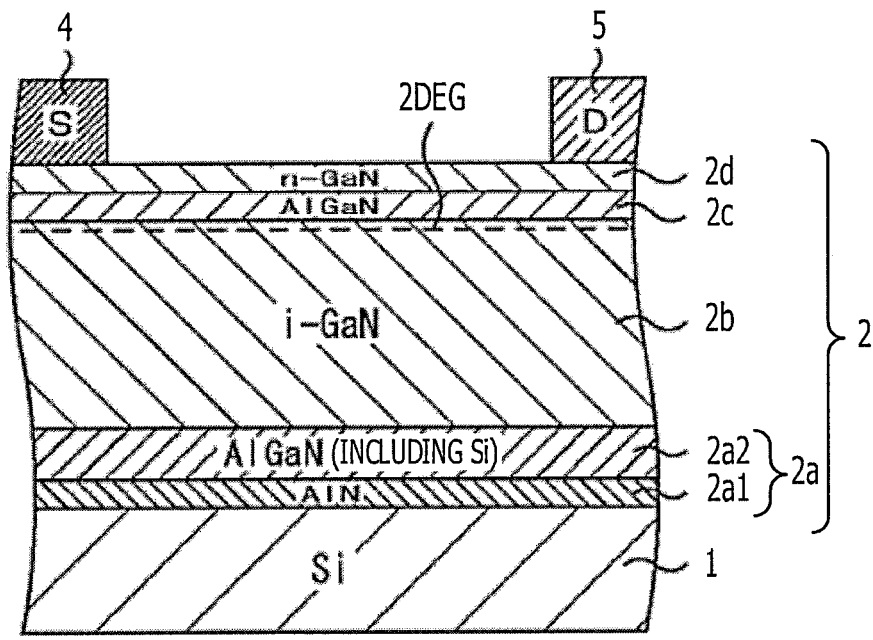
FIG. 4A is a schematic cross-sectional view illustrating a step following the step depicted in FIG. 3C.

Subsequently, as depicted in FIG. 4A, a source electrode 4 and a drain electrode 5 are formed. In particular, first, a resist mask forming the source electrode and the drain electrode is formed. A resist is applied on the compound semiconductor lamination structure 2 and is then processed by a lithographic technique. Accordingly, a resist mask is formed which has openings to expose portions on the surface of the cap layer 2d on which the source electrode and the drain electrode are to be formed.

As an electrode material, for example, Ti/Al (Ti for a lower layer and Al for an upper layer) are deposited by a deposition method or the like over the resist mask including the insides of the openings which expose the portions on which the source electrode and the drain electrode are to be formed. The thickness of Ti is set to approximately 20 nm, and the thickness of Al is set to approximately 200 nm. By a lift-off method, the resist mask and the Ti/Al deposited thereon are removed. Subsequently, the Si substrate 1 is heat-treated in a nitrogen atmosphere or the like at a temperature of approximately 400° C. to 1,000° C., such as approximately 600° C., so that remaining Ti/Al are ohmic-contacted with the cap layer 2d. When an ohmic contact between the Ti/Al and the cap layer 2d is obtained, the heat treatment may not be performed in some cases. Accordingly, the source electrode 4 and the drain electrode 5, which are ohmic-contacted with the cap layer 2d, are formed.

Figure 4B:
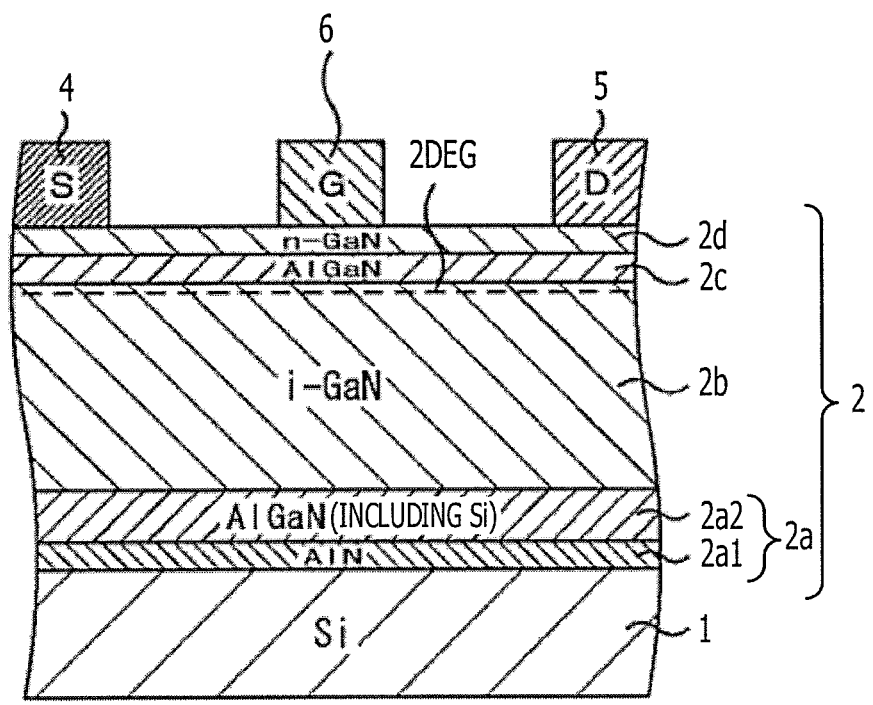
FIG. 4B is a schematic cross-sectional view illustrating a step following the step depicted in FIG. 4A.

Next, as depicted in FIG. 4B, a gate electrode 6 is formed. In particular, first, a resist mask forming the gate electrode is formed. A resist is applied over the entire surface of the element isolation region 3. In this case, for example, a two-layer resist having an eaves-structure suitable for a deposition method and a lift-off method is used. The resist thus applied is processed by a lithographic technique. Accordingly, a resist mask is formed which has an opening on the surface of the cap layer 2d to expose a portion on which the gate electrode is to be formed.

Next, as an electrode material, for example, Ni/Au (Ni for a lower layer and Au for an upper layer) are deposited on the resist mask including the inside of the opening, for example, by a deposition method. The thickness of Ni is set to approximately 30 nm, and the thickness of Au is set to approximately 400 nm. By a lift-off method, the resist mask and the Ni/Au deposited thereon are removed.

Accordingly, the gate electrode 6 which is Schottky-contacted with the cap layer 2d is formed thereon.

In addition, between the cap layer 2d and the gate electrode 6, an insulating film of $Al_2O_3$ or the like may be formed by deposition in some cases to form a gate insulating film.

Subsequently, through a backend process, such as various wire formation steps, the AlGaN/GaN HEMT of this embodiment is formed. Hereinafter, the operation and effect of the AlGaN/GaN HEMT formed as described above will be described.

Figure 5:
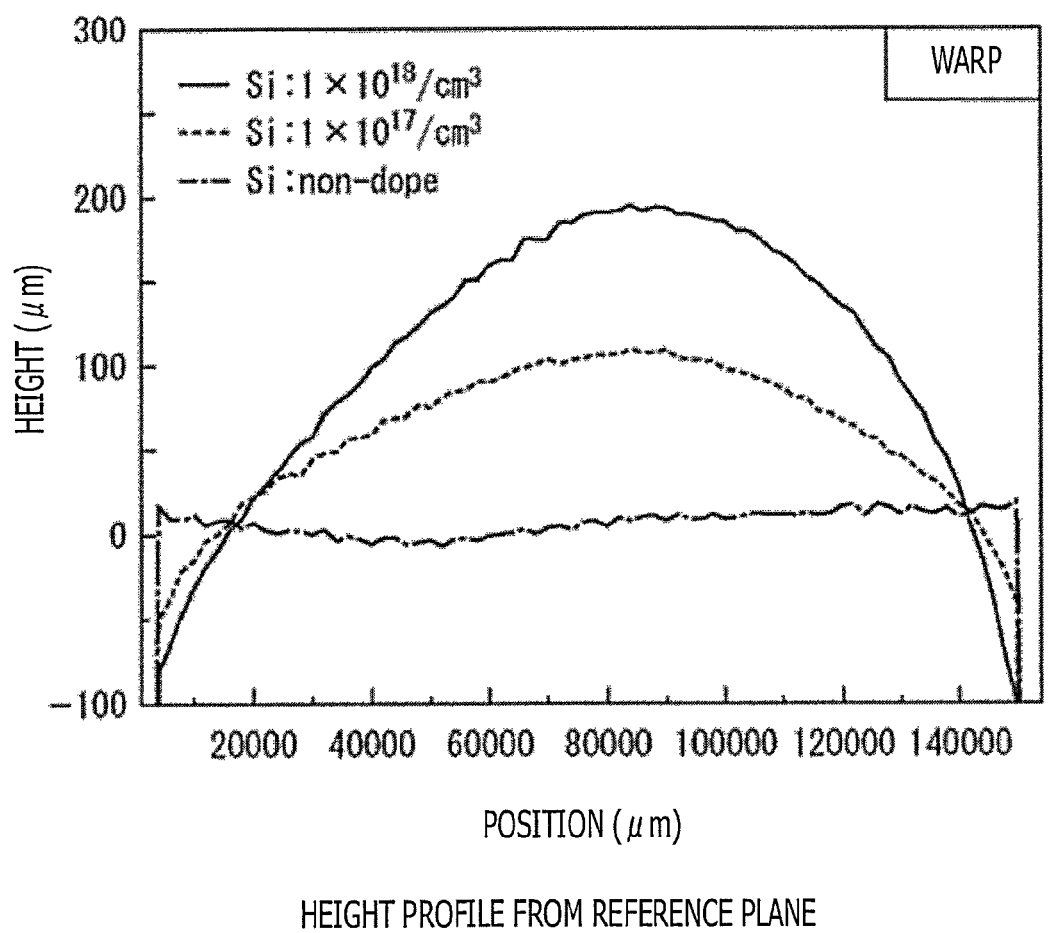
FIG. 5 is a characteristic diagram illustrating experimental results of a warp generated on a Si substrate caused by a second buffer layer of a compound semiconductor lamination structure.

In this embodiment, the warp generated on the Si substrate by the second buffer layer of the compound semiconductor lamination structure was investigated by experiments. In this case, specifically, in order to quantitatively understand the warp that is generated only by the formation of the second buffer layer, conditions were set so that the warp was not generated when the second buffer layer was not doped with Si (in a non-doped state). The experimental results are depicted in FIG. 5. FIG. 5 is a profile of a cross-sectional shape in the state in which the compound semiconductor lamination structure is formed on the Si substrate. As depicted in the figure, when the state in which the second buffer layer is non-doped is regarded as the base of warp (the state in which no warp is generated), it is found that when the second buffer layer is doped with Si, an upward convex warp is generated. In this case, it was confirmed that as the Si concentration doped into the second buffer layer was increased, the warpage in an upward convex state was increased. This phenomenon indicates that when the Si concentration doped into the second buffer layer is set to be high, the thickness of GaN which functions as an active layer (electron transit layer) may be further increased.

Figure 1A:
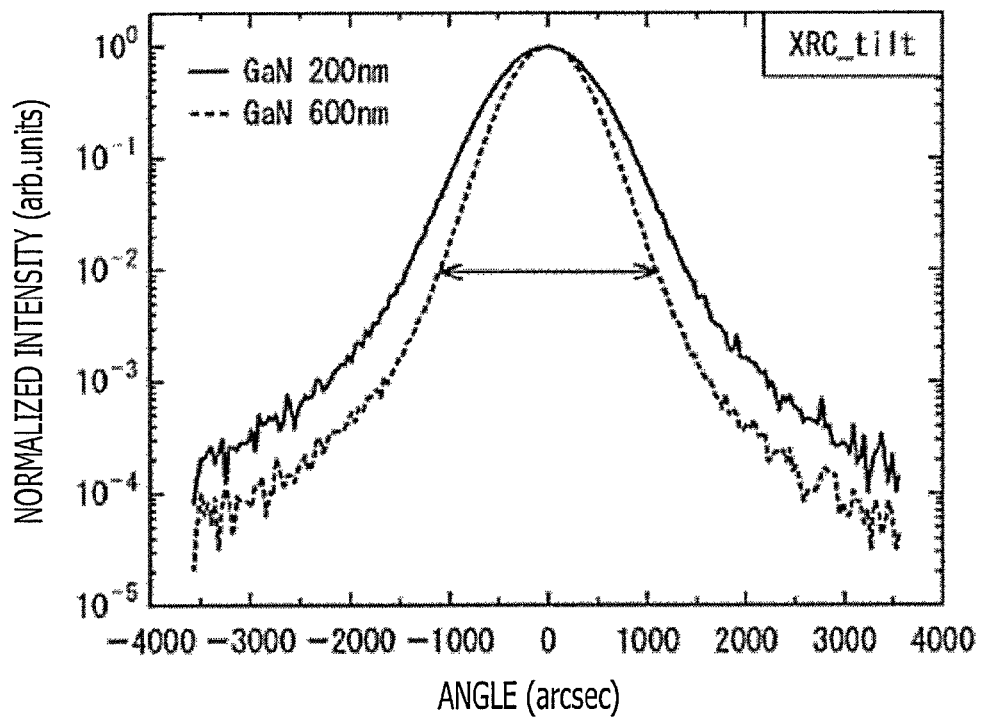
FIG. 1A and FIG. 1B are characteristic diagrams illustrating results of an active-layer thickness dependence of the quality of a GaN semiconductor device measured by an XRC method.
Figure 1B:
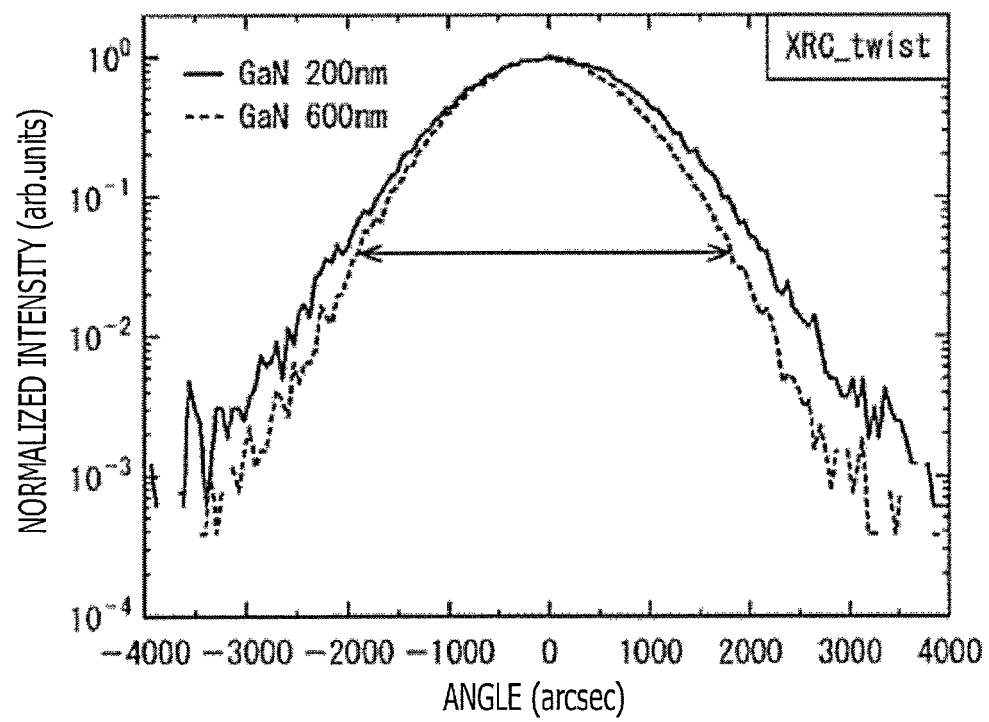
Figure 2A:
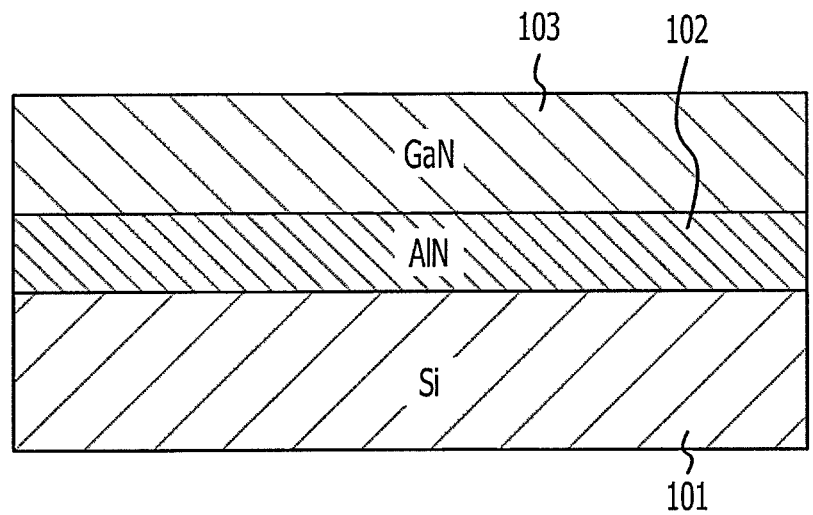
FIGS. 2A and 2B include parts (a) and (b) which are schematic cross-sectional views illustrating a problem that is generated when thick GaN functioning as an active layer is formed on a Si substrate.
Figure 2A:
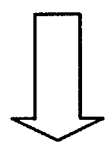
Figure 2B:
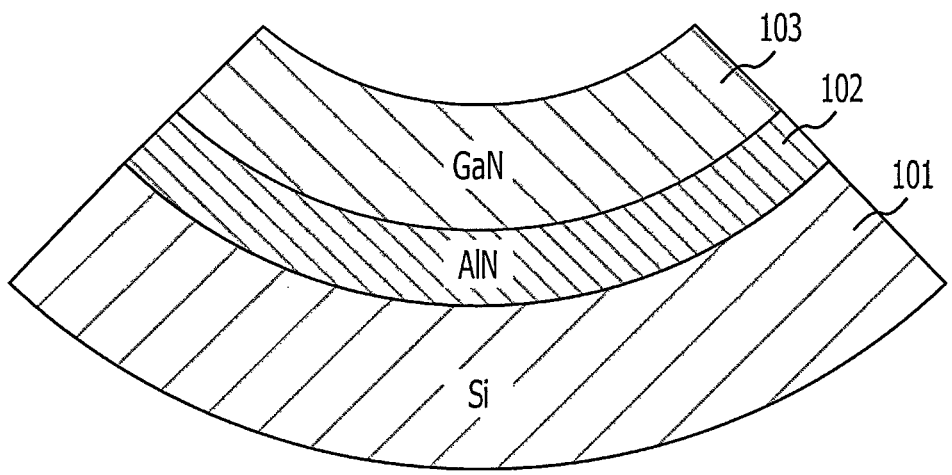

As described with reference to the parts (a) and (b) of FIG. 2, when a thick GaN layer is formed on a Si substrate with a buffer layer of AlN interposed therebetween, a downward convex warp is generated. In this embodiment, since the second buffer layer doped with Si is formed, an upward convex warp is generated. This upward convex warp compensates for the downward convex warp, and as a result, a Si substrate and a compound semiconductor lamination structure, in each of which no warp is generated, are obtained. The reason for this is believed that since defects are introduced in AlGaN by doping of Si, a stress from GaN formed on the AlGaN to the AlGaN is partially reduced, and as a result, the downward convex warp caused by thermal contraction is suppressed.

In this embodiment, since the Si substrate 1 (or SIC substrate or the like) which is inexpensive and is able to have a large diameter is used as a substrate for crystal growth, the manufacturing cost is reduced. In addition, in order to obtain a high quality active layer having a small number of defects, without considering the generation of warp and crack in the Si substrate 1 and the compound semiconductor lamination structure 2, improvement in dielectric breakdown withstand voltage may be achieved by further increasing the thickness of GaN functioning as the electron transit layer 2b, and improvement in quality may also be achieved by decreasing the dislocation density.

As described above, according to this embodiment, besides the reduction in manufacturing cost, the quality is improved by increasing the thickness of the electron transit layer, and a highly reliable AlGaN/GaN HEMT which is able to preferably suppress the generation of warp and crack by a simple structure may be realized.

Second Embodiment

Hereinafter, an AlGaN/GaN HEMT according to a second embodiment will be described. In this embodiment, although an AlGaN/GaN HEMT is disclosed as in the first embodiment, a second buffer layer of a compound semiconductor lamination structure is slightly different from that of the first embodiment.

Figure 6A:
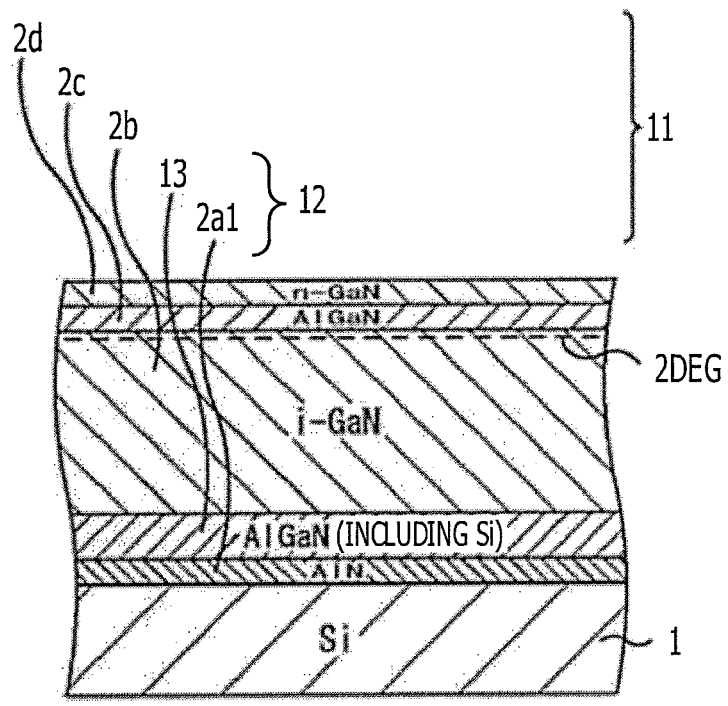
FIG. 6A is a schematic cross-sectional view illustrating a major step of a method for manufacturing an AlGaN/GaN HEMT according to a second embodiment.
Figure 6B:
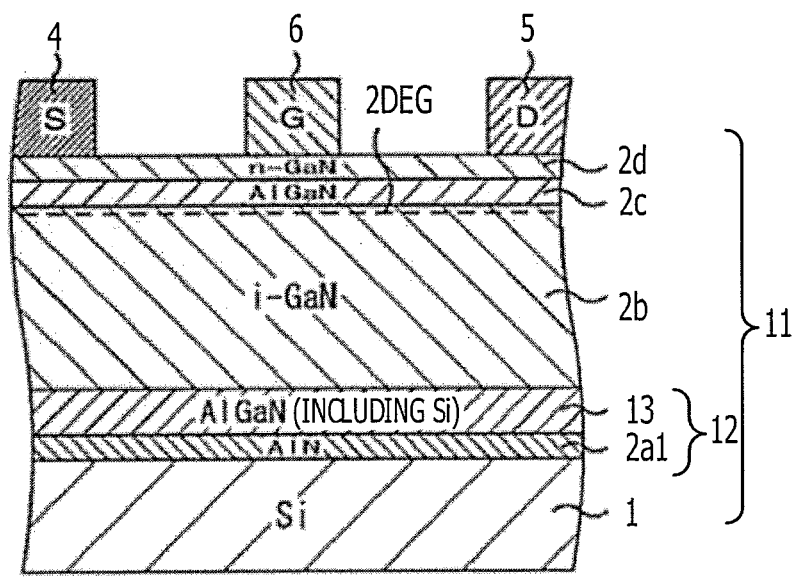
FIG. 6B is a schematic cross-sectional view illustrating a major step following the step depicted in FIG. 6A.

FIGS. 6A and 6B are schematic cross-sectional views sequentially illustrating major steps of a method for manufacturing an AlGaN/GaN HEMT according to the second embodiment. In addition, the same structural members and the like as those in the first embodiment are designated by the same reference numerals as those described above, and detailed descriptions thereof are omitted.

In this embodiment, as in the case of the first embodiment, the Si substrate 1 depicted in FIG. 3A is used as a substrate for crystal growth, and as depicted in FIG. 6A, on the Si substrate 1, as a laminate including a plurality of compound semiconductor layers, a compound semiconductor lamination structure 11 is formed.

The compound semiconductor lamination structure 11 is formed of a buffer layer 12, the electron transit layer 2b functioning as an active layer, the electron supply layer 2c, and the cap layer 2d. Between the electron transit layer 2b and the electron supply layer 2c, for example, a thin spacer layer of AlGaN may also be formed.

In this embodiment, the buffer layer 12 includes the first buffer layer 2a1 and a second buffer layer 13 formed thereon.

The first buffer layer 2a1 is formed of a compound semiconductor containing no impurities. The second buffer layer 13 is formed of a compound semiconductor containing an impurity, such as an n-type impurity (Si or the like). As the impurity to be contained, instead of the n-type impurity, a p-type impurity, such as Fe, Mg, or C, may also be used. In order to match the lattice constants of adjacent layers as much as possible, the compound semiconductor of the second buffer layer 13 is designed to have a lattice constant larger than that of the first buffer layer 2a1 and smaller than that of the electron transit layer 2b. When the first buffer layer 2a1 is formed, for example, of AlN, and when the electron transit layer 2b is formed, for example, of GaN, the second buffer layer 13 may be formed, for example, of AlGaN containing the impurity described above.

Figure 7:
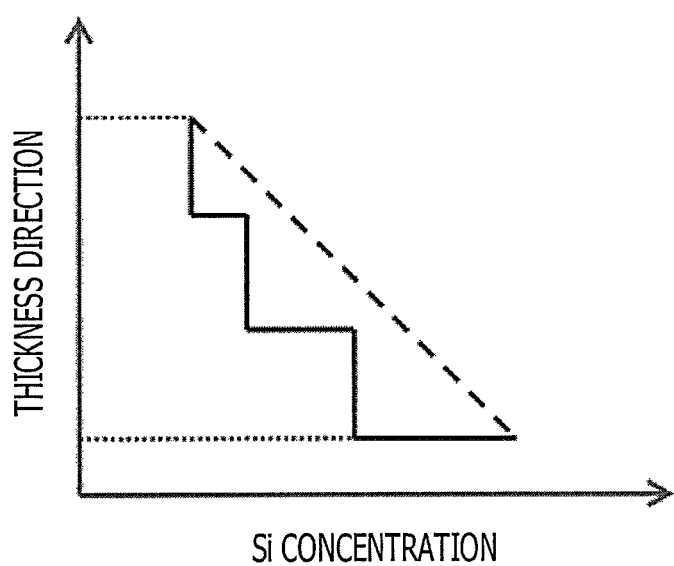
FIG. 7 is a characteristic diagram illustrating a particular example of modulation of impurity concentration of the second buffer layer of the AlGaN/GaN HEMT according to the second embodiment.

In the second buffer layer 13, the impurity concentration is modulated so as to be gradually decreased from a Si substrate 1 side to an electron transit layer 2b side. A particular example of the modulation of the impurity concentration is depicted in FIG. 7. The Si concentration of the second buffer layer 13 is decreased from the Si substrate 1 side to the electron transit layer 2b side in a stepwise manner (the solid line in FIG. 7) or in a continuous manner (the dotted line in FIG. 7).

In AlGaN functioning as the second buffer layer, when the Si concentration remaining in a surface layer thereof is excessively high, Si is diffused into the electron transit layer 2b located on the second buffer layer, and as a result, transistor characteristics may be degraded in some cases. In this embodiment, sine the second buffer layer 13 is formed while the concentration of Si to be doped is modulated as described above, the diffusion of Si doped into the second buffer layer 13 to the electron transit layer 2b is suppressed as much as possible, and hence, the degradation in transistor characteristics may be reduced. When the carrier activation rate in AlGaN by Si doping is regarded as 1, in order to control the residual carrier concentration in GaN of the electron transit layer 2b on the order of $10^{13}$ atoms/cm$^3$, the Si concentration is modulated so that the doping concentration of Si in the surface layer of the second buffer layer 13 is set to approximately $1\times10^{13}$ atoms/cm$^3$.

In order to form the second buffer layer 13, AlGaN is grown on the first buffer layer 2a1 while being doped with Si by concentration modulation.

As a raw material gas, a mixed gas containing a TMAl gas, a TMGa gas, and an NH$_3$ gas is used. The flow rate of the NH$_3$ gas is set to approximately 100 ccm to 10 LM. The growth pressure is set to approximately 50 to 300 Torr, and the growth temperature is set to approximately 1,000° C. to 1,200° C. For example, a SiH$_4$ gas containing Si is added as an n-type impurity to the raw material gas described above while the flow rate of the SiH$_4$ gas is gradually decreased in a stepwise manner or a continuous manner, so that AlGaN is doped with Si. The Si concentration of grown AlGaN is set to approximately $1\times10^{16}$ to $1\times10^{18}$ atoms/cm$^3$ at the lowermost layer portion and preferably approximately $1\times10^{17}$ atoms/cm$^3$ and is set to approximately $1\times10^{13}$ atoms/cm$^3$ at the uppermost layer portion.

After the compound semiconductor lamination structure 11 is formed, steps similar to those depicted in FIGS. 3C to 4B are sequentially performed. The state obtained after those steps is depicted in FIG. 6B. Subsequently, through a backend process, such as various wire formation steps, the AlGaN/GaN HEMT of this embodiment is formed.

As described above, according to this embodiment, besides the reduction in manufacturing cost, the quality is improved by increasing the thickness of the electron transit layer, and a highly reliable AlGaN/GaN HEMT which is able to preferably suppress the generation of warp and crack by a simple structure may be realized.

Third Embodiment

Hereinafter, an AlGaN/GaN HEMT according to a third embodiment will be described. In this embodiment, although an AlGaN/GaN HEMT is disclosed as in the first embodiment, a second buffer layer of a compound semiconductor lamination structure is slightly different from that of the first embodiment.

Figure 8A:
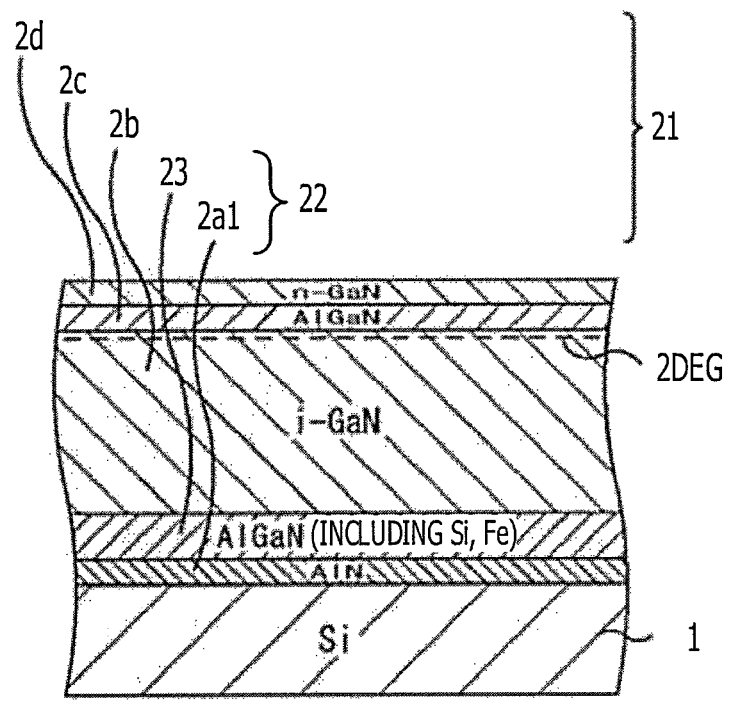
FIG. 8A is a schematic cross-sectional view illustrating a major step of a method for manufacturing an AlGaN/GaN HEMT according to a third embodiment.
Figure 8B:
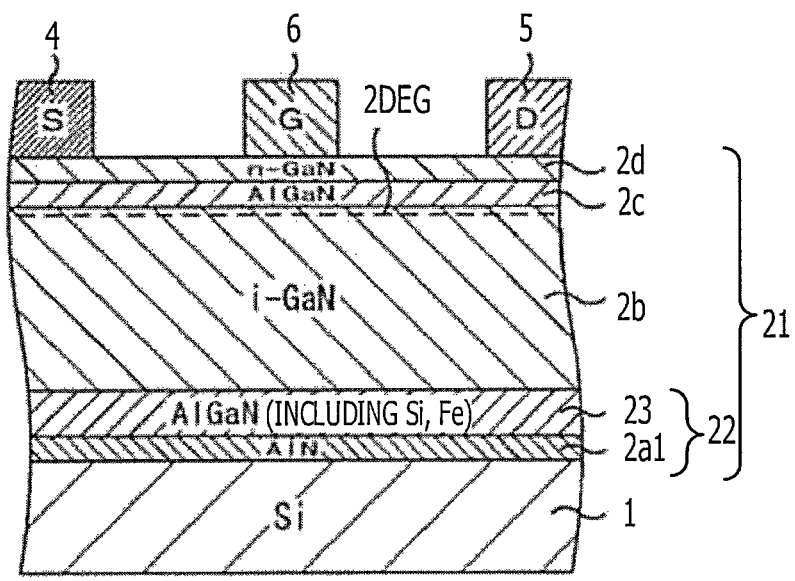
FIG. 8B is a schematic cross-sectional view illustrating a major step following the step depicted in FIG. 8A.

FIGS. 8A and 8B are schematic cross-sectional views sequentially illustrating major steps of a method for manufacturing an AlGaN/GaN HEMT according to the third embodiment. In addition, the same structural members and the like as those in the first embodiment are designated by the same reference numerals as those described above, and detailed descriptions thereof are omitted.

In this embodiment, as in the case of the first embodiment, the Si substrate 1 depicted in FIG. 3A is used as a substrate for crystal growth, and as depicted in FIG. 8A, on the Si substrate 1, as a laminate including a plurality of compound semiconductor layers, a compound semiconductor lamination structure 21 is formed.

The compound semiconductor lamination structure 21 is formed of a buffer layer 22, the electron transit layer 2b functioning as an active layer, the electron supply layer 2c, and the cap layer 2d. Between the electron transit layer 2b and the electron supply layer 2c, for example, a thin spacer layer of AlGaN may also be formed.

In this embodiment, the buffer layer 22 includes the first buffer layer 2a1 and a second buffer layer 23 formed thereon.

The first buffer layer 2a1 is formed of a compound semiconductor containing no impurities. The second buffer layer 23 is formed of a compound semiconductor containing as an impurity, a p-type (acceptor) impurity, such as Fe, besides an n-type (donor) impurity, such as Si. As the impurity to be contained, instead of using Fe, for example, Mg or C may also be used, or at least two types of Fe, Mg, and C or all of them may also be used. In order to match the lattice constants of adjacent layers as much as possible, the compound semiconductor of the second buffer layer 23 is designed to have a lattice constant larger than that of the first buffer layer 2a1 and smaller than that of the electron transit layer 2b. When the first buffer layer 2a1 is formed, for example, of AlN, and when the electron transit layer 2b is formed, for example, of GaN, the second buffer layer 23 may be formed, for example, of AlGaN containing the impurity described above.

In AlGaN functioning as the second buffer layer, when Si used as an n-type impurity is doped, residual carriers are generated, and by a current leak through the second buffer layer, the transistor characteristics may be degraded in some cases. In this embodiment, besides the n-type impurity, such as Si, since the p-type impurity, such as Fie, is doped, the carriers derived from Si are compensated for thereby, so that the generation of the current leak is suppressed. In addition, an acceptor level formed in the nitride layer (AlGaN in this embodiment) by Fe is deep, such as 1 eV or more, from the valance band, and hence, the generation of carriers by Fe itself may be ignored. Furthermore, in the case of Fe having an ion radius close to that of Ga as compared to that of Si, the influence of doping on the generation of warp is small.

The doping concentration of Si is approximately $1\times10^{16}$ to $1\times10^{18}$ atoms/cm$^3$ and preferably approximately $1\times10^{17}$ atoms/cm$^3$. As in the case of Si, the doping concentration of Fe is approximately $1\times10^{16}$ to $1\times10^{18}$ atoms/cm$^3$ and preferably approximately $1\times10^{17}$ atoms/cm$^3$. As in the case of Si, when the Fe concentration is controlled in the range described above, the degradation in crystallinity (increase in dislocation density) of the electron transit layer 2b caused by excessive doping of Fe may be suppressed.

In order to form the second buffer layer 23, AlGaN is grown on the first buffer layer 2a1 while being doped with Si by concentration modulation.

As a raw material gas, a mixed gas containing a TMAl gas, a TMGa gas, and an NH$_3$ gas is used. The flow rate of the NH$_3$ gas is set to approximately 100 ccm to 10 LM. The growth pressure is set to approximately 50 to 300 Torr, and the growth temperature is set to approximately 1,000° C. to 1,200° C. By using, for example, a SiH$_4$ gas containing Si as the n-type impurity and, for example, ferrocene (Cp$_2$Fe) containing Fe as the p-type impurity, AlGaN is doped with Si and Fe by addition of the two types of gases described above at predetermined flow rates to the raw material gas.

After the compound semiconductor lamination structure 21 is formed, steps similar to those depicted in FIGS. 3C to 4B are sequentially performed. The state obtained after those steps is depicted in FIG. 8B.

Subsequently, through a backend process, such as various wire formation steps, the AlGaN/GaN HEMT of this embodiment is formed.

As described above, according to this embodiment, besides the reduction in manufacturing cost, the quality is improved by increasing the thickness of the electron transit layer, and a highly reliable AlGaN/GaN HEMT which is able to preferably suppress the generation of warp and crack by a simple structure may be realized.

In addition, in this embodiment, the case in which the p-type impurity is further doped into the second buffer layer of the first embodiment is described by way of example, the present application is not limited to this embodiment.

For example, the second buffer layer of the second embodiment, that is, the second buffer layer modulated so that the concentration of the n-type impurity, such as Si, is gradually decreased from the Si substrate 1 side to the electron transit layer 2b, may be further doped with a p-type impurity. In this case, as is the Si concentration, the Fe concentration of the second buffer layer is modulated so that the p-type impurity, such as Fe, is gradually decreased from the Si substrate 1 side to the electron transit layer 2b side. In particular, this p-type impurity concentration is decreased from the Si substrate 1 side to the electron transit layer 2b side in a stepwise manner or a continuous manner.

As described above, according to this embodiment, besides the reduction in manufacturing cost, the quality is improved by increasing the thickness of the electron transit layer, and a highly reliable AlGaN/GaN HEMT which is able to preferably suppress the generation of warp and crack by a simple structure may be realized.

Fourth Embodiment

Hereinafter, an AlGaN/GaN HEMT according to a fourth embodiment will be described. In this embodiment, although an AlGaN/GaN HEMT is disclosed as in the first embodiment, a second buffer layer of a compound semiconductor lamination structure is slightly different from that of the first embodiment.

Figure 9A:
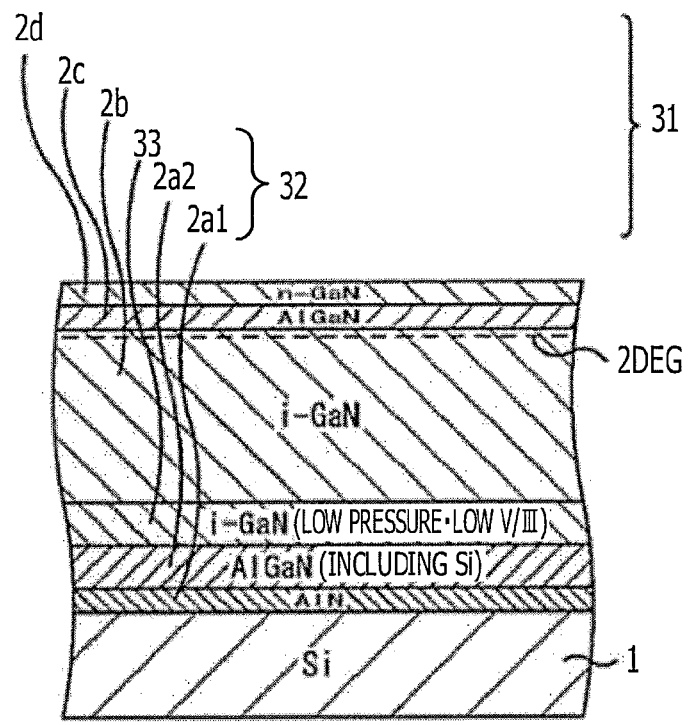
FIG. 9A is a schematic cross-sectional view illustrating a major step of a method for manufacturing an AlGaN/GaN HEMT according to a fourth embodiment.
Figure 9B:
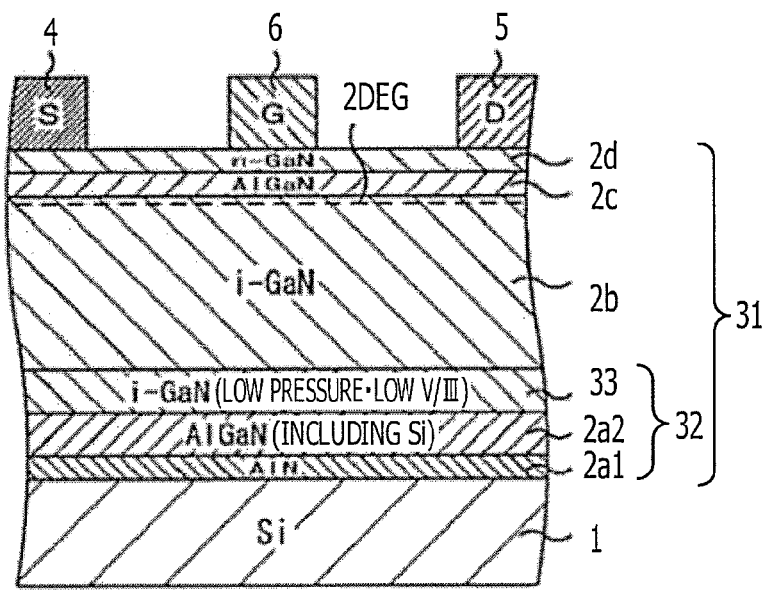
FIG. 9B is a schematic cross-sectional view illustrating a major step following the step depicted in FIG. 9A.

FIGS. 9A and 9B are schematic cross-sectional views sequentially illustrating major steps of a method for manufacturing an AlGaN/GaN HEMT according to the fourth embodiment. In addition, the same structural members and the like as those in the first embodiment are designated by the same reference numerals as those described above, and detailed descriptions thereof are omitted.

In this embodiment, as in the case of the first embodiment, the Si substrate 1 depicted in FIG. 3A is used as a substrate for crystal growth, and as depicted in FIG. 9A, on the Si substrate 1, as a laminate including a plurality of compound semiconductor layers, a compound semiconductor lamination structure 31 is formed.

The compound semiconductor lamination structure 31 is formed of a buffer layer 32, the electron transit layer 2b functioning as an active layer, the electron supply layer 2c, and the cap layer 2d. Between the electron transit layer 2b and the electron supply layer 2c, for example, a thin spacer layer of AlGaN may also be formed.

In this embodiment, the buffer layer 32 includes the first buffer layer 2a1, the second buffer layer 2a2 formed thereon, and a third buffer layer 33.

The first buffer layer 2a1 is formed of a compound semiconductor containing no impurities. The second buffer layer 2a2 is formed of a compound semiconductor containing an impurity, such as an n-type impurity (Si or the like). As the impurity to be contained, a p-type impurity, such as Fe, Mg, or C, may be used instead of the n-type impurity. In order to match the lattice constants of adjacent layers as much as possible, the compound semiconductor of the second buffer layer 2a2 is designed to have a lattice constant larger than that of the first buffer layer 2a1 and smaller than that of the electron transit layer 2b. When the first buffer layer 2a1 is formed, for example, of AlN, and when the electron transit layer 2b is formed, for example, of GaN, the second buffer layer 2a2 may be formed, for example, of AlGaN containing the impurity described above.

The third buffer layer 33 is formed as the uppermost layer of the buffer layer 32, contains no impurities, and has the same composition as that of the electron transit layer 2b, that is, is formed of GaN in this embodiment, and the rate of lateral overgrowth thereof is high as compared to that of GaN of the electron transit layer 2b.

When the electron transit layer 2b is formed right over AlGaN doped with an impurity, such as Si, functioning as the second buffer layer, by the impurity concentration, threading dislocations at a high density are introduced in GaN functioning as the electron transit layer 2b. Hence, the degradation in transistor characteristics may disadvantageously occur in some cases. In this embodiment, on the second buffer layer 2a2, that is, between the second buffer layer 2a2 and the electron transit layer 2b, i-GaN is grown, for example, under a low pressure condition and a low V/III ratio condition, so that the third buffer layer 33 is formed. In the third buffer layer 33, by the growth conditions described above, the lateral overgrowth of GaN is enhanced as compared to that of the electron transit layer 2b, and hence, some of the dislocations transmitted from the second buffer layer 2a2 may be suppressed.

In order to form the third buffer layer 33, i-GaN is grown on the second buffer layer 2a2 under a low pressure condition and a low V/III ratio condition, for example, to have a thickness of approximately 100 to 400 nm.

As a raw material gas, a mixed gas containing a TMGa gas and an $NH_3$ gas is used. The flow rate of the $NH_3$ gas is set to approximately 100 ccm to 10 ML. The growth pressure is set to approximately 5 to 40 kPa, the V/III ratio is set to approximately 100 to 1,000, and the growth temperature is set to approximately 1,000° C. to 1,200° C.

After the compound semiconductor lamination structure 31 is formed, steps similar to those depicted in FIGS. 3C to 4B are sequentially performed. The state obtained after those steps is depicted in FIG. 9B.

Subsequently, through a backend process, such as various wire formation steps, the AlGaN/GaN HEMT of this embodiment is formed.

As described above, according to this embodiment, besides the reduction in manufacturing cost, the quality is improved by increasing the thickness of the electron transit layer, and a highly reliable AlGaN/GaN HEMT which is able to preferably suppress the generation of warp and crack by a simple structure may be realized.

In addition, in this embodiment, although the case in which besides the first and the second buffer layers according to the first embodiment, the third buffer layer is formed as the uppermost layer is described by way of example, the present application is not limited to this embodiment.

For example, on the second buffer layer according to the second embodiment, that is, on the second buffer layer which is modulated so that the n-type impurity, such as Si, is gradually decreased from the Si substrate 1 side to the electron transit layer 2b side, a third buffer layer having the structure described above may be further formed.

In addition, on the second buffer layer according to the third embodiment, that is, on the second buffer layer into which the p-type impurity, such as Fe, is doped besides the n-type impurity, such as Si, a third buffer layer having the structure described above may be further formed.

In addition, on the second buffer layer according to the second and the third embodiments, a third buffer layer having the structure described above may be further formed. In this case, in the second buffer layer, an n-type impurity, such as Si, is modulated so as to be gradually decreased from the Si substrate 1 side to the electron transit layer 2b side, and besides the n-type impurity, such as Si, a p-type impurity, such as Fe, is doped.

Fifth Embodiment

In this embodiment, a power source device using one AlGaN/GaN HEMT selected from the first to the fourth embodiments will be described.

Figure 10:
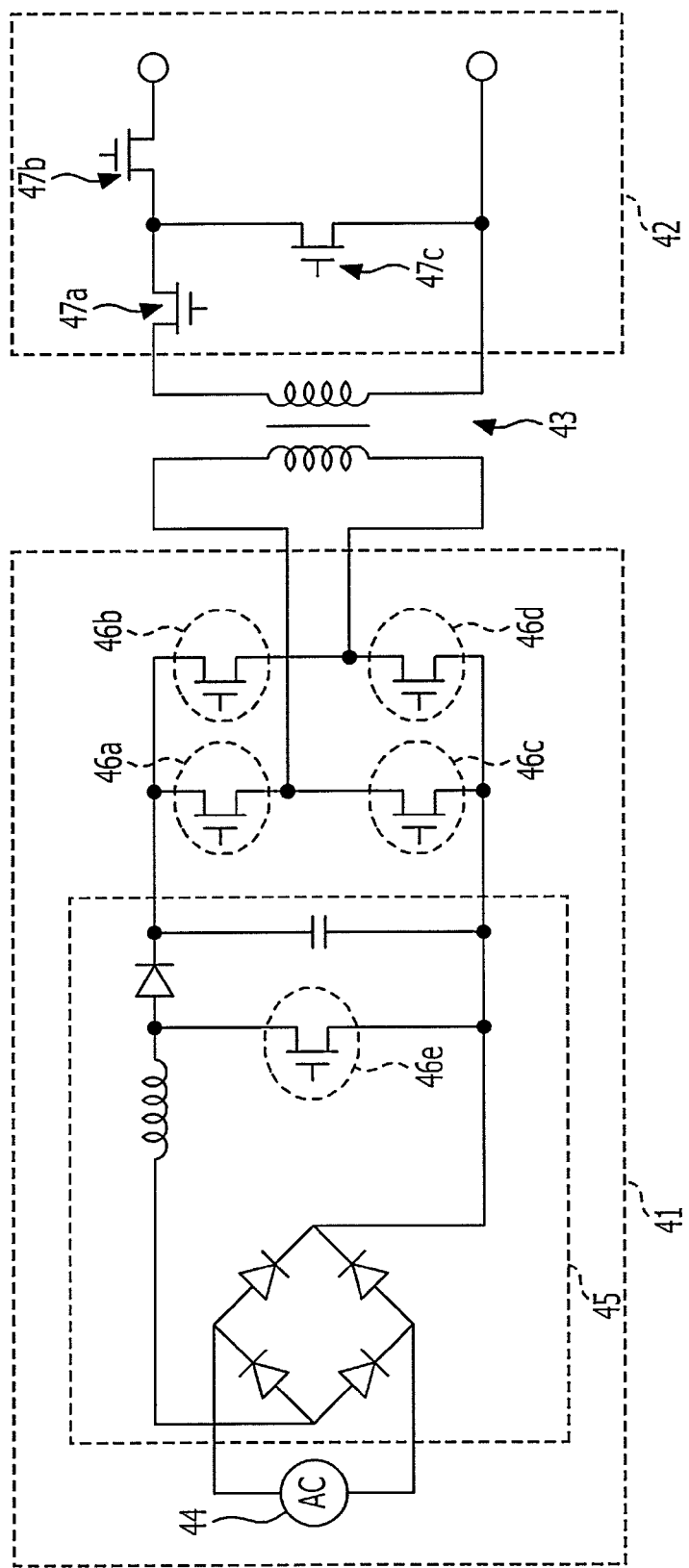
FIG. 10 is a circuit diagram illustrating a schematic structure of a power source device according to a fifth embodiment.

FIG. 10 is a circuit diagram illustrating a schematic structure of a power source device according to a fifth embodiment.

The power source device according to this embodiment includes a high-voltage primary circuit 41, a low-voltage secondary circuit 42, and a transformer 43 disposed therebetween.

The primary circuit 41 includes an alternating current power source 44, a so-called bridge rectifier circuit 45, and a plurality (four in this embodiment) of switching elements 46a, 46b, 46c, and 46d. In addition, the bridge rectifier circuit 45 includes a switching element 46e.

The secondary circuit 42 includes a plurality (three in this embodiment) of switching elements 47a, 47b, and 47c.

In this embodiment, the switching elements 46a, 46b, 46c, 46d, and 46e of the primary circuit 41 are each formed of one AlGaN/GaN HEMT selected from the first to the fourth embodiments. On the other hand, the switching elements 47a, 47b, and 47c of the secondary circuit 42 are each formed of a general MIS FET using silicon.

In this embodiment, a highly reliable AlGaN/GaN HEMT in which besides the reduction in manufacturing cost, the quality is improved by increasing the thickness of the electron transit layer, and the generation of warp and crack is preferably suppressed by a simple structure is applied to a high voltage circuit. Accordingly, a highly reliable and high-power power source circuit is realized.

Sixth Embodiment

In this embodiment, a high-frequency amplifier using one AlGaN/GaN HEMT selected from the first to the fourth embodiments will be described.

Figure 11:
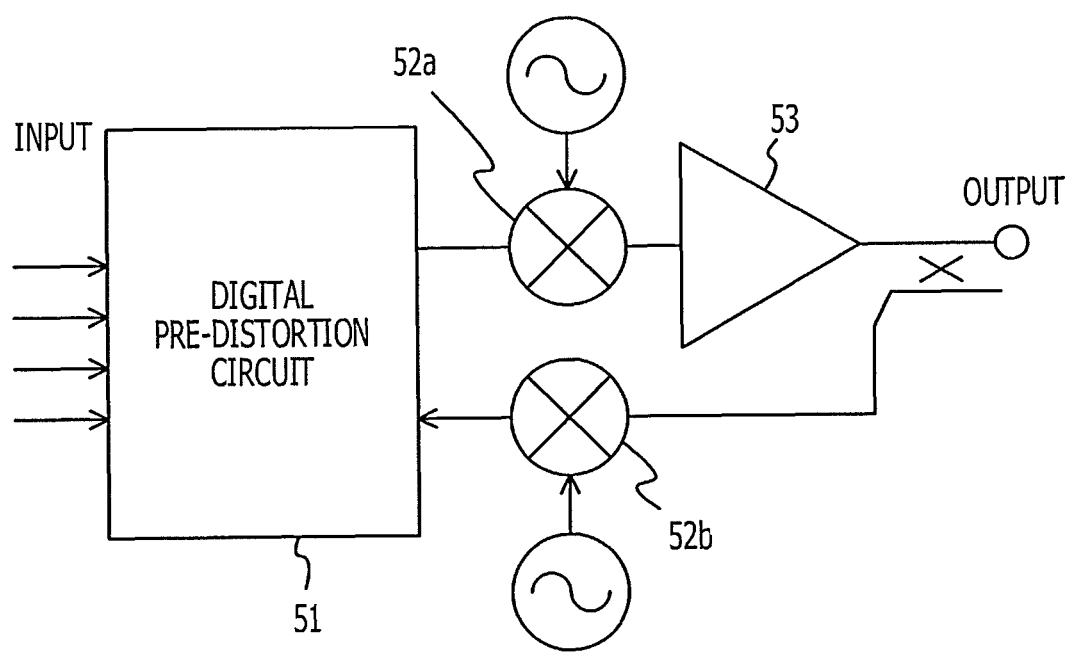
FIG. 11 is a circuit diagram illustrating a schematic structure of a high-frequency amplifier according a sixth embodiment.

FIG. 11 is a circuit diagram illustrating a schematic structure of a high-frequency amplifier according to a sixth embodiment.

The high-frequency amplifier according to this embodiment includes a digital pre-distortion circuit 51, mixers 52a and 52b, and a power amplifier 53.

The digital pre-distortion circuit 51 compensates for nonlinear distortion of an input signal. The mixer 52a mixes an alternating current signal and an input signal, the nonlinear distortion of which is compensated for. The power amplifier 53 amplifies an input signal mixed with an alternating current signal and includes one AlGaN/GaN HEMT selected from the first to the fourth embodiments. In addition, as depicted in FIG. 11, the structure is formed so that, for example, by changing a switch, a signal at an output side is mixed with an alternating current signal by the mixer 52b and is then sent to the digital pre-distortion circuit 51.

In this embodiment, a highly reliable AlGaN/GaN HEMT in which besides the reduction in manufacturing cost, the quality is improved by increasing the thickness of the electron transit layer, and the generation of warp and crack is preferably suppressed by a simple structure is applied to a high-frequency amplifier. Accordingly, a highly reliable high-frequency amplifier having a high withstand voltage is realized.

OTHER EMBODIMENTS

In the first to the sixth embodiments, as the compound semiconductor device, the AlGaN/GaN HEMT has been described by way of example. As the compound semiconductor device, the present application may also be applied to the following HEMTs besides the AlGaN/GaN HEMT.

Another HEMT Example 1

In this example, as the compound semiconductor device, an InAlN/GaN HEMT will be described.

InAlN and GaN are compound semiconductors which may make the difference in lattice constants therebetween smaller by adjusting the compositions thereof. In this case, in the first to the sixth embodiments, the first buffer layer is formed of AlN, the second buffer layer is formed of AlGaN doped with an impurity, such as Si, the third buffer layer is formed of i-GaN, the electron transit layer is formed of i-GaN, the electron supply layer is formed of n-InAlN, and the cap layer is formed of n-GaN. In addition, since piezoelectric polarization is hardly generated in this case, the two-dimensional electron gas is primarily generated by spontaneous polarization of InAlN.

According to this example, as is the AlGaN/GaN HEMT described above, besides the reduction in manufacturing cost, the quality is improved by increasing the thickness of the electron transit layer, and a highly reliable InAlN/GaN HEMT which is able to preferably suppress the generation of warp and crack by a simple structure may be realized.

Another HEMT Example 2

In this example, as the compound semiconductor device, an InAlGaN/GaN HEMT will be described.

GaN and InAlGaN are compound semiconductors, and the latter may decrease the lattice constant by adjusting the composition thereof as compared to the former. In this case, in the first to the sixth embodiments, the first buffer layer is formed of AlN, the second buffer layer is formed of AlGaN doped with an impurity, such as Si, the third buffer layer is formed of i-GaN, the electron transit layer is formed of i-GaN, the electron supply layer is formed of n-InAlGaN, and the cap layer is formed of n-GaN.

According to this example, as is the AlGaN/GaN HEMT described above, besides the reduction in manufacturing cost, the quality is improved by increasing the thickness of the electron transit layer, and a highly reliable InAlGaN/GaN HEMT which is able to preferably suppress the generation of warp and crack by a simple structure may be realized.

Another HEMT Example 3

In this example, as the compound semiconductor device, an $Al_xGa_{1-x}N/Al_yGa_{1-y}N$ HEMT will be described.

In the AlGaN/AlGaN HEMT of this example, the electron transit layer is formed of $Al_yGa_{1-y}N$ having a low Al composition ratio as compared to that of $Al_xGa_{1-x}N$ of the electron supply layer (y<x). In particular, although the Al composition ratio of AlGaN of the electron supply layer is approximately 30% or less (x≤0.3), the Al composition ratio of AlGaN of the electron transit layer is set to approximately 20% or less (y≤0.2, and y<x) which is lower than that of the electron supply layer. In this case, in the first to the sixth embodiments, the first buffer layer is formed of AlN, the second buffer layer is formed of AlGaN doped with an impurity, such as Si, the third buffer layer is formed of i-AlGaN, and the cap layer is formed of n-GaN.

According to this example, as is the AlGaN/GaN HEMT described above, besides the reduction in manufacturing cost, the quality is improved by increasing the thickness of the electron transit layer, and a highly reliable $Al_xGa_{1-x}N/Al_yGa_{1-y}N$ HEMT which is able to preferably suppress the generation of warp and crack by a simple structure may be realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:
   a substrate; and
   a compound semiconductor lamination structure formed over the substrate, the compound semiconductor lamination structure including
   a first buffer layer not containing an impurity,
   a second buffer layer formed over the first buffer layer and containing an impurity,
   a third buffer layer formed over the second buffer layer and not containing an impurity, and
   an active layer formed over the third buffer layer,
   wherein the third buffer layer has the same composition as that of the active layer, has a high ratio of lateral overgrowth as compared to that of the active layer.

2. The compound semiconductor device according to claim 1, wherein
   the second buffer layer has a lattice constant larger than that of the first buffer layer and smaller than that of the active layer.

3. The compound semiconductor device according to claim 1,
   wherein the impurity includes an n-type impurity, a p-type impurity, or any combination thereof.

4. The compound semiconductor device according to claim 1, wherein
   in the second buffer layer, the concentration of the impurity is gradually decreased from a substrate side to an active layer side.

5. A method for manufacturing a compound semiconductor device, the method comprising:
   forming a first buffer layer that does not contain an impurity;
   forming a second buffer layer over the first buffer layer, the second buffer layer contains an impurity;
   forming a third buffer layer over the second buffer layer, the third buffer layer does not contain an impurity; and
   forming an active layer formed over the third buffer layer,
   wherein the third buffer layer has the same composition as that of the active layer, has a high ratio of lateral overgrowth as compared to that of the active layer.

6. The method for manufacturing a compound semiconductor device according to claim 5, wherein
   the second buffer layer has a lattice constant larger than that of the first buffer layer and smaller than that of the active layer.

7. The method for manufacturing a compound semiconductor device according to claim 5, wherein
   the impurity includes an n-type impurity, a p-type impurity, or any combination thereof.

8. The method for manufacturing a compound semiconductor device according to claim 5, wherein
   in the second buffer layer, the concentration of the impurity is gradually decreased from a substrate side to an active layer side.

9. The method for manufacturing a compound semiconductor device according to claim 5, wherein
   the third buffer layer is formed under a low pressure and a low V/III ratio condition as compared to that for the active layer.

10. A power source device comprising:
    a high-voltage circuit including
    a transistor including
      a substrate, and
      a compound semiconductor lamination structure formed over the substrate, the compound semiconductor lamination structure including
      a first buffer layer not containing an impurity,
      a second buffer layer formed over the first buffer layer and containing an impurity,
      a third buffer layer formed over the second buffer layer and not containing an impurity, and
      an active layer formed over the third buffer layer;
    a low-voltage circuit; and
    a transformer formed between the high-voltage circuit and the low-voltage circuit,
    wherein the third buffer layer has the same composition as that of the active layer, has a high ratio of lateral overgrowth as compared to that of the active layer.

11. A high frequency amplifier which amplifies and sends an input high frequency voltage, the amplifier comprising:
    a transistor including
    a substrate, and
    a compound semiconductor lamination structure formed over the substrate, the compound semiconductor lamination structure including
    a first buffer layer not containing an impurity,
    a second buffer layer formed over the first buffer layer and containing an impurity,
    a third buffer layer formed over the second buffer layer and not containing an impurity, and
    an active layer formed over the third buffer layer,
    wherein the third buffer layer has the same composition as that of the active layer, has a high ratio of lateral overgrowth as compared to that of the active layer.

* * * * *